(12) United States Patent
Pan et al.

(10) Patent No.: US 11,942,448 B2
(45) Date of Patent: Mar. 26, 2024

(54) INTEGRATED CIRCUIT DIE PAD CAVITY

(71) Applicant: TEXAS INSTRUMENTS INCORPORATED, Dallas, TX (US)

(72) Inventors: Bo-Hsun Pan, New Taipei (TW);
Hung-Yu Chou, Taipei (TW);
Chung-Hao Lin, Taipei (TW);
Yuh-Harng Chien, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 82 days.

(21) Appl. No.: 17/377,719

(22) Filed: Jul. 16, 2021

(65) Prior Publication Data
US 2023/0016577 A1     Jan. 19, 2023

(51) Int. Cl.
| H01L 21/56 | (2006.01) |
| H01L 21/48 | (2006.01) |
| H01L 23/00 | (2006.01) |
| H01L 23/28 | (2006.01) |

(52) U.S. Cl.
CPC .......... *H01L 24/48* (2013.01); *H01L 21/4828* (2013.01); *H01L 21/565* (2013.01); *H01L 23/28* (2013.01); *H01L 24/29* (2013.01); *H01L 24/32* (2013.01); *H01L 2224/04042* (2013.01); *H01L 2224/48091* (2013.01); *H01L 2224/48177* (2013.01)

(58) Field of Classification Search
CPC ... H01L 24/48; H01L 21/4828; H01L 21/565; H01L 23/28; H01L 24/29; H01L 24/32; H01L 2224/04042; H01L 2224/48091; H01L 2224/48177; H01L 24/92; H01L 24/85; H01L 24/73; H01L 2224/48228; H01L 2224/85203; H01L 2224/85207; H01L 2224/85801; H01L 2924/00014; H01L 2924/181; H01L 23/49586; H01L 23/49582; H01L 2224/48465; H01L 2224/73265; H01L 2224/8592; H01L 2224/92247; H01L 2924/14; H01L 2924/35121; H01L 23/49503

See application file for complete search history.

(56) References Cited

U.S. PATENT DOCUMENTS

2016/0157345 A1* 6/2016 Kobayashi ........ H01L 23/49503
                                                     361/767
2018/0350755 A1* 12/2018 Huang .................... H01L 25/18

* cited by examiner

*Primary Examiner* — Elias Ullah
(74) *Attorney, Agent, or Firm* — Ronald O. Neerings; Frank D. Cimino

(57) ABSTRACT

An integrated circuit and method of making an integrated circuit is provided. The integrated circuit includes an electrically conductive pad having a generally planar top surface that includes a cavity having a bottom surface and sidewalls extending from the bottom surface of the cavity to the top surface of the pad. An electronic device is attached to the top surface of the electrically conductive pad. A wire bond is attached from the electronic device to the bottom surface of the cavity. A molding compound encapsulates the electronic device.

23 Claims, 5 Drawing Sheets

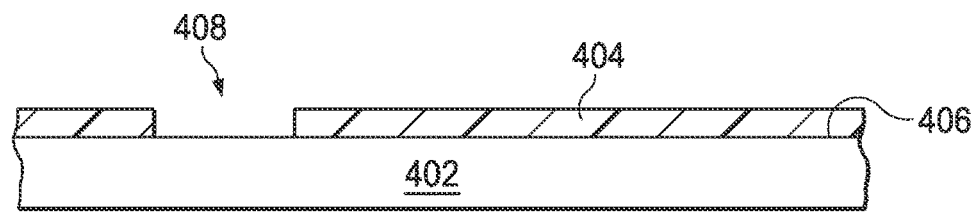
FIG. 4
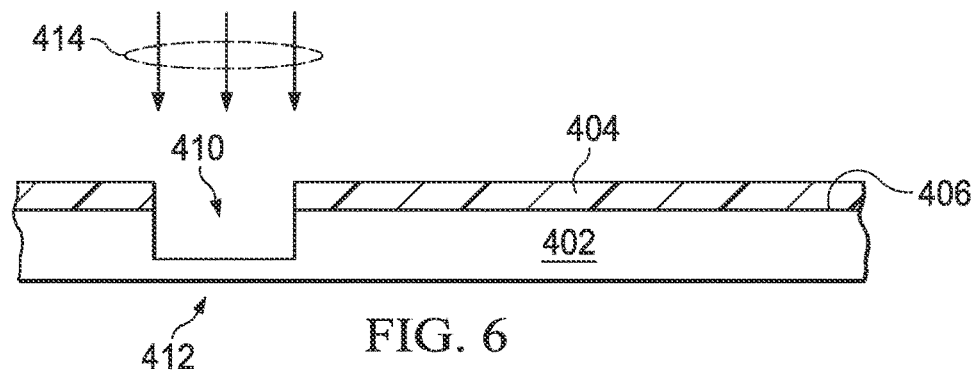
FIG. 5
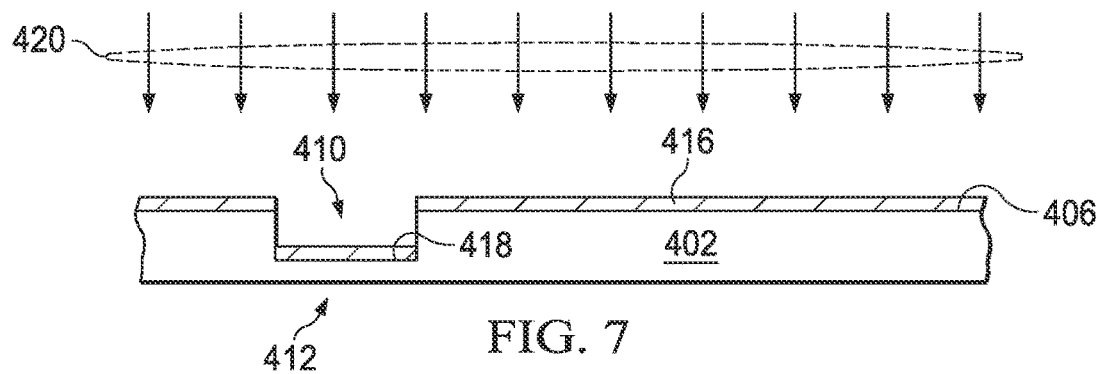
FIG. 6
FIG. 7

INTEGRATED CIRCUIT DIE PAD CAVITY

TECHNICAL FIELD

The present disclosure relates generally to integrated circuits, and more specifically to an integrated circuit having a die pad that includes a cavity defined therein.

BACKGROUND

In integrated circuit packages, die pad delamination has the potential risk of creating an open circuit between a wire bond that is connected from a die to a surface of a die pad during a curing heating process. The cause of this phenomena is a coefficient of thermal expansion (CTE) mismatch between the die pad and a mold compound during the curing process. The CTE mismatch creates high thermal stresses between the die pad and the mold compound. The stresses result in a delamination force on the surface of the die pad, which causes the mold compound to fracture or pull away from the die pad. As a result, a lamination layer deposited on the die pad also fractures or pulls away from the die pad due to the delamination force created by the fracture of the mold compound. Consequently, the lamination layer pulls the wire bond away from the die pad thereby disconnecting the wire bond from the die pad causing the open circuit.

SUMMARY

In described examples, an integrated circuit comprises an electrically conductive pad having a generally planar top surface that includes a cavity having a bottom surface and sidewalls extending from the bottom surface of the cavity to the top surface of the electrically conductive pad. An electronic device is attached to the top surface of the electrically conductive pad. A wire bond is attached from the electronic device to the bottom surface of the cavity. A molding compound encapsulates the electronic device.

In another described example, a method of fabricating integrated circuits comprises providing an electrically conductive die pad having a generally planar top surface. A cavity is etched in the electrically conductive die pad and a die is attached on the electrically conductive die pad. A wire bond is attached from the die to the metal plating layer deposited on the bottom surface of the cavity. A mold compound is formed over the die and in the cavity.

BRIEF DESCRIPTION OF THE DRAWINGS

FIG. 4 is a schematic cross-sectional view of a die pad in the early stages of fabrication of the integrated circuit package of FIG. 1.

FIG. 5 is a schematic cross-sectional view of the integrated circuit package of FIG. 4 after undergoing deposition of a mask.

FIG. 6 is a schematic cross-sectional view of the integrated circuit package of FIG. 5 after undergoing a partial etching process.

FIG. 7 is a schematic cross-sectional view of the integrated circuit package of FIG. 6 after undergoing a deposition of a metal plating layer.

DETAILED DESCRIPTION

Disclosed herein is an example integrated circuit package that includes a cavity to increase a contact area with a mold compound to resist the delamination force during a curing process thereby overcoming the aforementioned disadvantages. The wire bond is connected from the die to a bottom surface of the cavity in which the bottom surface of the cavity lies below the surface of the die pad. Since the cavity is then filled with the mold compound, the cavity configuration increases the contact or bonding area with mold compound which resists the delamination force during the curing process. Thus, the cavity serves as a locking feature by increasing the surface area (bonding area) between the die pad and the mold compound. In addition, the delamination force is stronger on the top surface of the die pad than on a surface that may lie below the top surface of the die pad. Thus, since the bottom surface of the cavity is below the top surface of the die pad, the delamination force on the bottom surface of the cavity is less than the delamination force on the top surface of the die pad. Therefore, the cavity also serves as a stress relief feature relieving stress between the die pad and the mold compound.

The cavity can be etched into the die pad in a ground area on the die pad. The ground area serves as a ground connection area for wire bonds to provide a ground for the die. The wire bond can be connected from the die to the bottom surface of the cavity. Thus, in one example, the wire bond is a ground wire and the cavity is a ground bar cavity.

Figure 1:
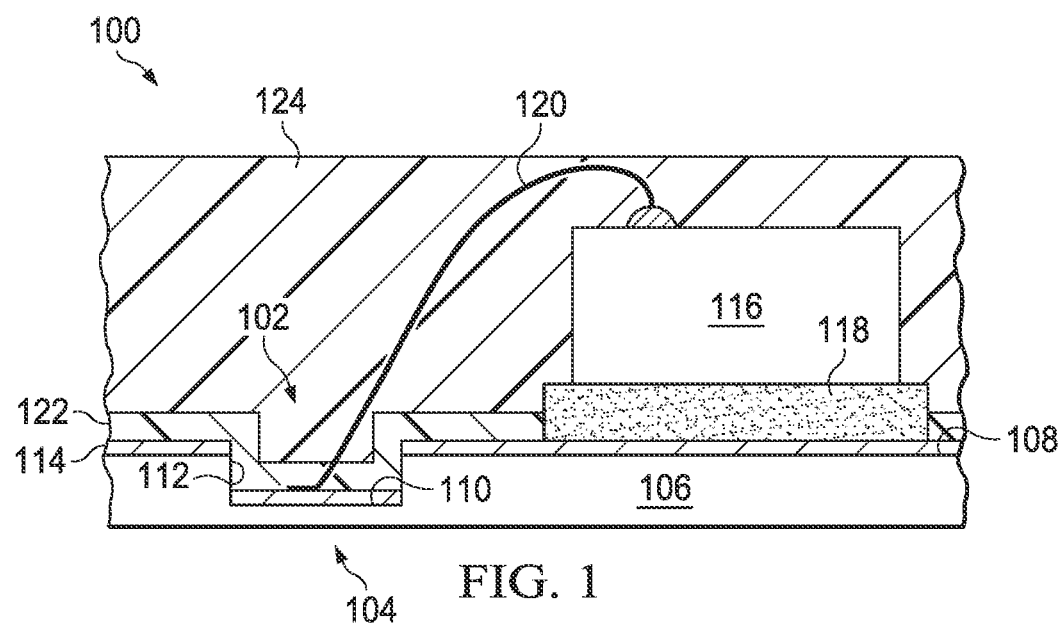
FIG. 1 is an example integrated circuit package that incorporates a ground bar cavity.

FIG. 1 is an example integrated (IC) package 100 that includes a cavity 102 (e.g., ground bar cavity) etched into an area (e.g., ground area) 104 of an electrically conductive pad (e.g., die pad) 106 having a generally planar top surface 108. The cavity 102 is formed in the top surface 108 of the die pad 106 via a partial etching process. The cavity 102 includes a bottom surface 110 and side walls 112 that extend from the bottom surface 110 of the cavity 102 to the top surface 108 of the die pad 106. The IC package 100 further includes a metal (e.g., nickel, palladium, nickel/palladium, gold, silver, copper, etc.) plating layer 114 deposited on the top surface 108 of the die pad 106 and on the bottom surface 110 of the cavity 102.

An electronic device (e.g., a die) 116 is attached to the metal plating layer 114 that has been deposited on the top surface 108 of the die pad 106 via a die attach (e.g., bonding agent) 118. The die 116 can be made from a semi-conductive material (e.g., silicon, gallium arsenide, etc.) and can include electronic components embedded therein thus, forming an integrated circuit. A wire bond 120 is attached (e.g., thermosonic (heat and energy) bonding, ball (heat) bonding, compliant (heat and pressure) bonding, soldering, etc.) to the die 116 and is connected (e.g., thermosonic (heat and energy) bonding, ball (heat) bonding, compliant (heat and pressure) bonding, by soldering) to the metal plating layer 114 on the bottom surface 110 of the cavity 102. Although, a die 116 is described herein and illustrated in the figures, it is to be understood that in other examples the wire bond 120 can attach from the bottom surface 110 of the cavity 102 to another type of functional electronic device on the die pad 106, to a substrate in the IC package 100, to metal in the IC package 100, directly to a lead frame, etc.

The IC package 100 further includes a laminate layer 122 deposited over the metal plating layer 114. The laminate layer 122 is also deposited on the metal plating layer 114 on the bottom surface 110 of the cavity 102 and on the side walls 112 of the cavity 102. The laminate layer 122 covers an end portion of the wire bond 120 that is connected to the metal plating layer 114 on the bottom surface 110 of the cavity 102. A mold compound 124 is deposited on the laminate layer 122 such that the mold compound 124 encapsulates the die 116 and the die attach 118. In addition, the mold compound 124 is deposited in the cavity 102 such that the mold compound 124 extends down to the metal plating layer 114 deposited on the bottom surface 110 of the cavity 102.

As mentioned above, the configuration of the cavity increases the contact area between the die pad and the mold compound, which relieves thermal stresses between the die pad, the lamination layer, and the mold compound. As a result, the delamination force that results from the CTE mismatch between the differing materials that occurs during the mold compound curing process is reduced. In addition, the delamination force is stronger on the top surface of the die pad than on a surface that may lie below the top surface of the die pad. Thus, since the bottom surface of the cavity is below the top surface of the die pad, the delamination force on the bottom surface of the cavity is less than the delamination force on the top surface of the die pad.

Figure 2:
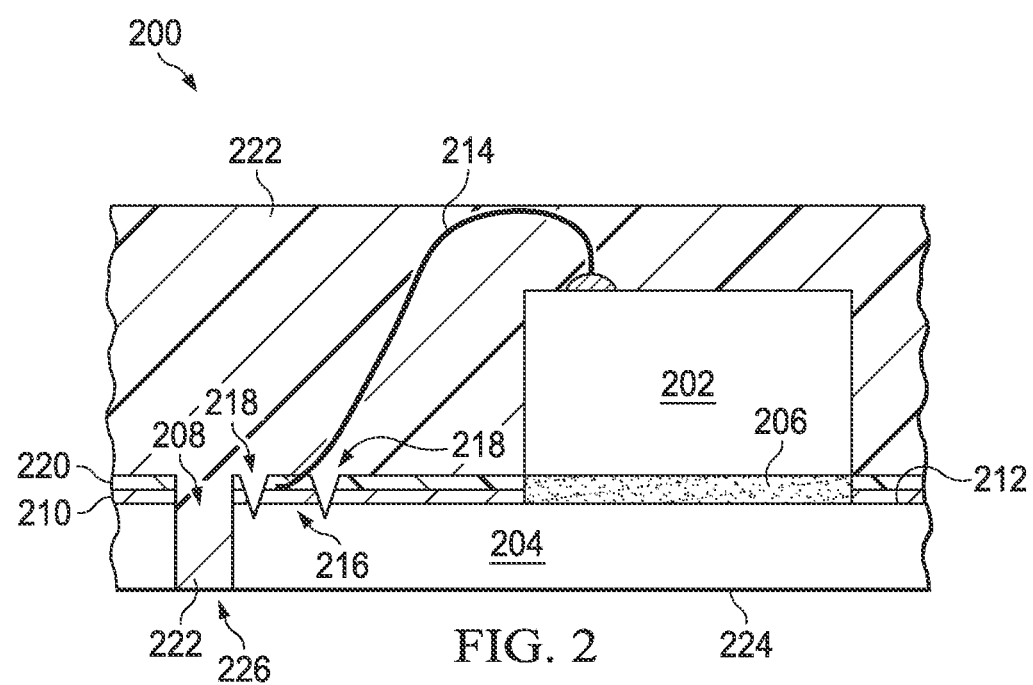
FIG. 2 is another example of an integrated circuit package that incorporates a mold lock configuration.
Figure 3:
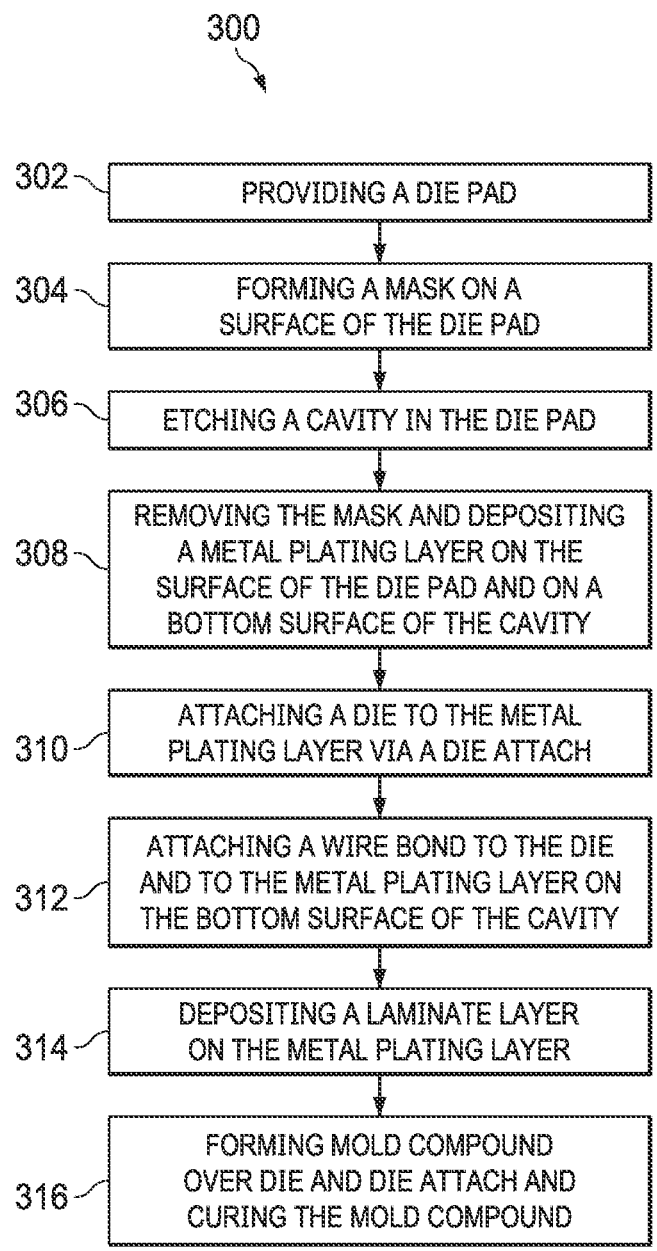
FIG. 3 is a flow diagram for a method of fabricating the integrated circuit package of FIG. 1.

FIG. 2 is an example integrated (IC) package 200 that includes a die 202 attached a die pad 204 via a die attach (e.g., bonding agent) 206. The IC package 200 includes an opening 208 etched through the die pad 204. The IC package 200 further includes a metal (e.g., Ni/Pd) plating layer 210 deposited on a first (top) surface 212 of the die pad 204. A wire bond 214 is connected from the die 202 to the metal plating layer 210 in a ground area 216 of the die pad 204. Channels or grooves 218 are cut into the metal plating layer 210 and into the die pad 204. The channels 218 surround the ground area 216 of the die pad 204 and thus, define a location of the ground area 216 on the die pad 204. The IC package 200 further includes a laminate layer 220 deposited over the metal plating layer 210. The laminate layer 220 covers a portion of the wire bond 214 that is connected to the metal plating layer 210.

A mold compound 222 is deposited on the laminate layer 220 such that the mold compound 222 encapsulates the die 202 and the die attach 206. In addition, the mold compound 222 is deposited in the opening 208 such that the mold compound 222 extends through the die pad 204 to a second surface 224 of the die pad 204. The formation of the mold compound 222 in the opening 208 creates a mold lock 226. The mold lock 226 is configured to increase the mold compound adhesion strength on the die pad 204, which creates a stronger bond between the die pad 204 and the mold compound 222. Thus, when the mold compound 222 is cured, the additional bonding surface area between the die pad and the mold compound provides a stronger bond between the die pad and the mold compound to reduce the delamination force.

Although, the mold lock 226 resists the delamination force created on the surface of the die pad during the curing process, the mold lock 226 is disadvantageous. Specifically, as mentioned above, the delamination force is the strongest on the top surface of the die pad. Thus, the size (e.g., diameter, length, width) of the opening needs to be sufficient enough to provide a force to counteract the delamination force. As a result, the opening, and hence the mold lock, requires additional space on the die pad, which in turn limits the wire bond bonding area and affects the design margin criteria of the IC package. In addition, since a goal of integrated circuit design is to reduce the physical footprint of the integrated circuit, the additional space required for the opening to form the mold lock is disadvantageous.

The example IC package 100 illustrated in FIG. 1, on the other hand, combats the delamination force by providing a cavity in the die pad, as described above. Still further, the example IC package 100 utilizes existing space (i.e., ground area) on the die pad 106. As a result, the additional space required for the mold lock is eliminated thereby facilitating the fabrication of smaller IC packages. Still further, the need to change an existing IC package design to accommodate the mold lock is eliminated.

Referring to FIGS. 3-11, FIG. 3 illustrates a fabrication flow diagram 300 and FIGS. 4-11 illustrate a fabricating process 400 in connection with the integrated circuit (IC) package 100 illustrated in FIG. 1. Though depicted sequentially as a matter of convenience, at least some of the actions shown can be performed in a different order and/or performed in parallel. Alternatively, some implementations may perform only some of the actions shown. Still further, although the example illustrated in FIGS. 3-11 is an example method illustrating the example configuration of FIG. 1, other methods and configurations are possible.

At 302 a die pad 402 is provided, as illustrated in FIG. 4. At 304, a photoresist material layer is deposited on a surface (top surface) 406 of the die pad 402 (FIG. 5). The photoresist material layer is patterned and developed to expose an opening 408 in the photoresist material layer to form a mask 404, thereby exposing the die pad 402 within the opening 408 (FIG. 5). The photoresist material layer can have a thickness that varies in correspondence with the wavelength of radiation used to pattern the photoresist material layer. The photoresist material layer may be formed over the die pad 402 via spin-coating or spin casting deposition techniques, selectively irradiated (e.g., via deep ultraviolet (DUV) irradiation) and developed to form the mask 404.

Figure 8:
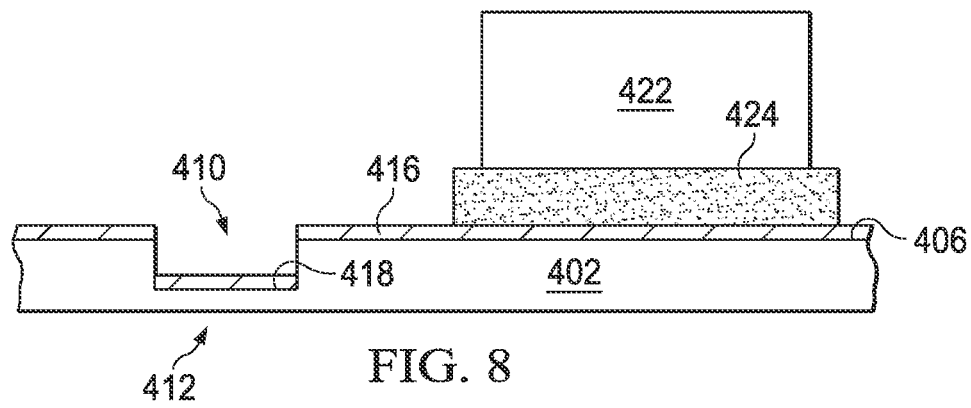
FIG. 8 is a schematic cross-sectional view of the integrated circuit package of FIG. 7 after attachment of a die on the metal plating layer via a die attach.
Figure 9:
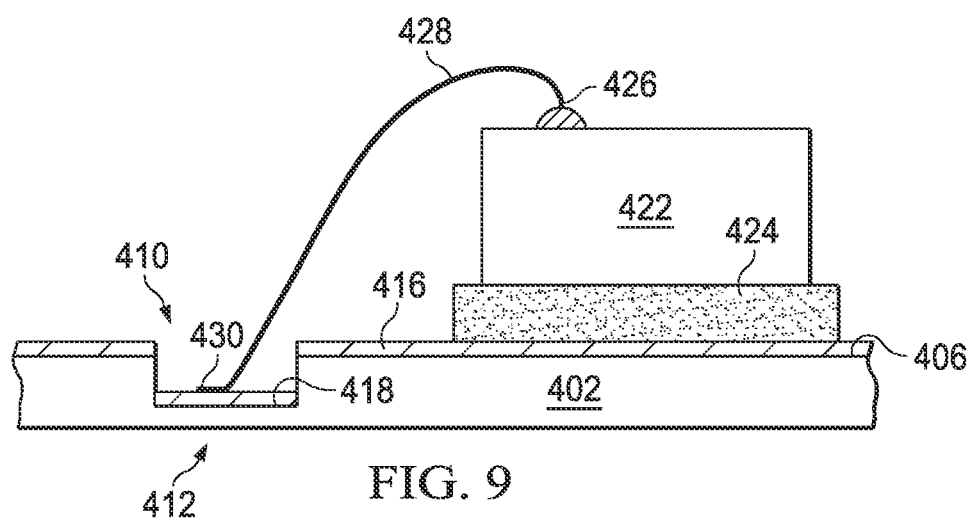
FIG. 9 is a schematic cross-sectional view of the integrated circuit package of FIG. 8 after attachment of a wire bond.

At 306, a cavity 410 is etched (e.g., chemical, pure plasma, anisotropic reactive ion etching (RIE), etc.) into a ground area 412 of the die pad 402 (FIG. 6). The etching process is a partial etching (or timed etching) process 414 such that the cavity 410 is etched into the die pad 402 a predetermined distance from the surface 406 of the die pad 402. At 308, the mask 404 is removed via a reducing agent comprised of ammonia and/or hydrogen, ammonia and nitrogen, hydrogen and nitrogen, or a combination thereof and a metal plating layer (e.g., Ni/Pd) 416 is deposited on the surface 406 of the die pad 402 and on a bottom surface 418 of the cavity 410 (FIG. 7). The metal plating layer 416 is deposited via an electroplating or electrodeposition process 420. At 310, a die 422 is attached to the metal plating layer 416 via a die attach (e.g., adhesive thermally and/or electrically conductive bonding agent) 424 (FIG. 8). At 312, a first end 426 of a wire bond 428 is attached to the die 422 via a bump bond or soldering process and a second end 430 of the wire bond 428 is attached to the metal plating layer 416 disposed on the bottom surface 418 of the cavity 410 via a bump bond or soldering process (FIG. 9).

Figure 10:
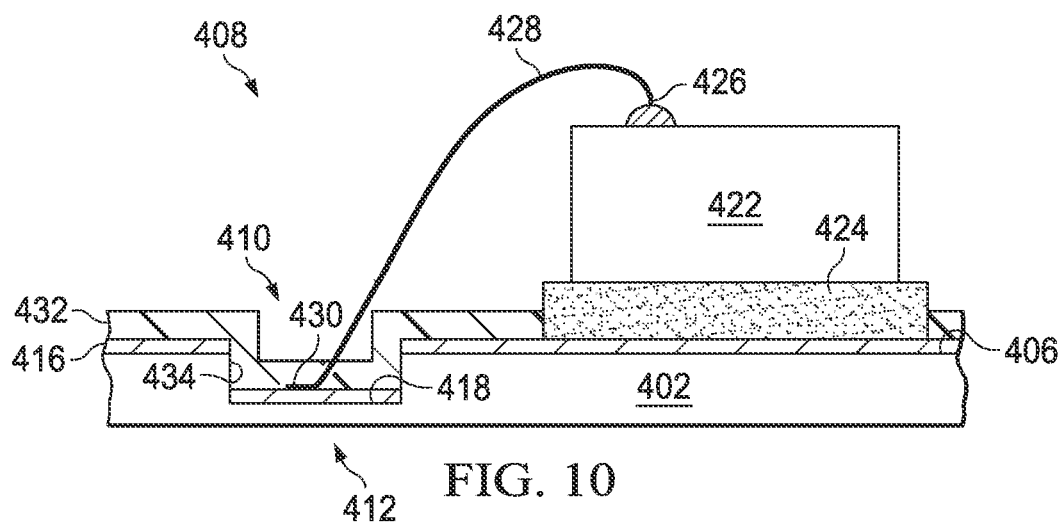
FIG. 10 is a schematic cross-sectional view of the integrated circuit package of FIG. 9 after deposition of a laminate layer on the metal plating layer.
Figure 11:
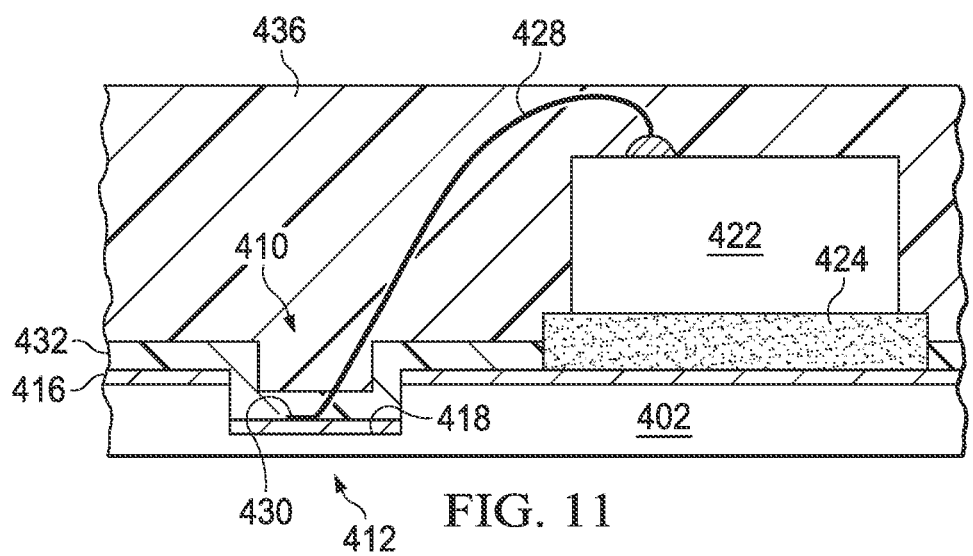
FIG. 11 is a schematic cross-sectional view of the integrated circuit package of FIG. 10 after a formation of a mold compound over the die and die attach.

At 314, a laminate layer 432 is deposited on the metal plating layer 416 (FIG. 10). The laminate layer 432 is also deposited on metal plating layer 416 deposited on the bottom surface 418 and on sidewalls 434 of the cavity 410. The laminate layer 432 covers or encapsulates the second end 430 of the wire bond 428 that is connected to the metal plating layer 416 on the bottom surface 418 of the cavity 410. The laminate layer 432 can be made from materials such as polypropylene, polystyrene, polyester, vinyl, polyvinyl fluoride, vinyl chloride, methyl methacrylate, nylon, polycarbonate, etc. A surface of the laminate layer 432 may be subjected to processing treatments such as embossing. At 316, a mold compound 436 is formed over the IC package and cured during a curing process (FIG. 11). The mold compound 436 is formed such that the mold compound 436 encapsulates the die 422 and the die attach 424. In addition, the mold compound 436 is deposited in the cavity 410 such that the mold compound 436 extends down to the metal plating layer 416 deposited on the bottom surface 418 of the cavity 410. The mold compound 436 can be made from an epoxy or epoxy blends, silicone, polyimide, etc.

In yet another example an alternative to etching die attach 106 to form cavity 102 is to form cavity 102 via a milling process wherein a drill bit or other tool cuts or mills into the planar top surface 108 of die pad 106 to form cavity 102.

In still another example an alternative to etching die attach 106 to form cavity 102 is to use a punch, press or other tool to deform the planar top surface 108 to form cavity 102 in die pad 106 via a coining process.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean based at least in part.

What is claimed is:

1. A method of fabricating integrated circuits, the method comprising:
   providing an electrically conductive die pad having a generally planar top surface;
   etching a cavity in the electrically conductive die pad;
   attaching a die on the electrically conductive die pad;
   attaching a wire bond from the die to a bottom surface of the cavity; and
   forming a mold compound over the die and in the cavity.

2. The method of claim 1, wherein prior to etching the cavity in the electrically conductive die pad, the method further comprising depositing a mask on the top surface of the electrically conductive die pad.

3. The method of claim 2, wherein depositing the mask on the top surface of the electrically conductive die pad includes depositing a photoresist layer on the top surface of the electrically conductive die pad, and patterning and developing the photoresist layer to expose an opening in the photoresist layer thereby forming the mask.

4. The method of claim 1, wherein etching the cavity in the electrically conductive die pad includes performing a partial etch in a ground area of the electrically conductive die pad.

5. The method of claim 4, wherein the cavity is a ground bar cavity and the wire bond is a ground wire configured to provide a ground for the die.

6. A method of fabricating integrated circuits, the method comprising:
   providing an electrically conductive die pad having a generally planar top surface;
   depositing a photoresist layer on the top surface of the electrically conductive die pad, and patterning and developing the photoresist layer to expose an opening in the photoresist layer thereby forming a mask;
   etching a cavity in the electrically conductive die pad;
   removing the mask via a reducing agent;
   attaching a die on the electrically conductive die pad;
   attaching a wire bond from the die to a bottom surface of the cavity; and
   forming a mold compound over the die and in the cavity.

7. The method of claim 6, wherein after the mask is removed, the method further comprising depositing a metal plating layer on the top surface of the electrically conductive die pad and on the bottom surface of the cavity.

8. The method of claim 7, wherein prior to forming the mold compound over the die and in the cavity, the method further comprising depositing a laminate layer on the metal plating layer deposited on the electrically conductive die pad, the metal plating layer deposited on the bottom surface of the cavity, and on sidewalls of the cavity.

9. The method of claim 8, wherein the laminate layer is formed over an end of the wire bond that is connected to the metal plating layer deposited on the bottom surface of the cavity.

10. The method of claim 7, wherein attaching the die on the electrically conductive die pad includes attaching the die to the metal plating layer via a die attach.

11. The method of claim 6, wherein the reducing agent is comprised of at least one of ammonia, hydrogen, ammonia and nitrogen, hydrogen and nitrogen, and a combination thereof.

12. A method of fabricating integrated circuits, the method comprising:
   providing an electrically conductive die pad having a generally planar top surface;
   forming a cavity in the electrically conductive die pad;
   attaching a die on the electrically conductive die pad;
   attaching a wire bond from the die to a bottom surface of the cavity; and
   forming a mold compound over the die and in the cavity.

13. The method of claim 12, wherein the cavity in the electrically conductive die pad is formed using a milling process.

14. The method of claim 12, wherein the cavity in the electrically conductive die pad is formed using a coining process.

15. An integrated circuit, comprising:
   an electrically conductive pad having a generally planar top surface that includes a cavity having a bottom surface and sidewalls extending from the bottom surface of the cavity to the top surface of the electrically conductive pad;
   an electronic device attached to the top surface of the electrically conductive pad;

a wire bond attached from the electronic device to the bottom surface of the cavity; and a mold compound encapsulating the electronic device.

16. The integrated circuit of claim 15, wherein the electrically conductive pad is a die pad and the electronic device is a die.

17. The integrated circuit of claim 15, further comprising a metal plating layer deposited on the top surface of the die pad and on the bottom surface of the cavity.

18. The integrated circuit of claim 15, wherein the die is attached to the metal plating layer on the electrically conductive die pad via a die attach.

19. An integrated circuit, comprising:
   an electrically conductive pad having a generally planar top surface that includes a cavity having a bottom surface and sidewalls extending from the bottom surface of the cavity to the top surface of the electrically conductive pad;
   a metal plating layer deposited on the top surface of the electrically conductive pad and the bottom surface of the cavity;
   an electronic device attached to the top surface of the electrically conductive pad;
   a wire bond attached from the electronic device to the bottom surface of the cavity;
   a laminate layer deposited on the metal plating layer, the laminate layer covering an end of the wire bond that connects to the metal plating layer deposited on the bottom surface of the cavity; and
   a mold compound encapsulating the electronic device.

20. The integrated circuit of claim 19, wherein the laminate layer is comprised of at least one of polypropylene, polystyrene, polyester, vinyl, polyvinyl fluoride, vinyl chloride, methyl methacrylate, nylon, and polycarbonate.

21. The integrated circuit of claim 20, wherein the mold compound is deposited in the cavity and extends down to the metal plating layer deposited on the bottom surface of the cavity.

22. The integrated circuit of claim 21, wherein the cavity is defined in a ground area of the electrically conductive die pad and the cavity is a ground bar cavity and the wire bond is a ground wire bond configured to provide a ground for the die.

23. The integrated circuit of claim 22, wherein the ground bar cavity is configured to relieve stress between the die pad and the mold compound due to a coefficient of thermal expansion mismatch between the die pad and the mold compound during a curing process.

* * * * *